(12) United States Patent
Hibbs (10) Patent No.: US 6,835,502 B2
(45) Date of Patent: Dec. 28, 2004

(54) IN-SITU PELLICLE MONITOR

(75) Inventor: Michael Straight Hibbs, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 175 days.

(21) Appl. No.: 10/064,442

(22) Filed: Jul. 15, 2002

(65) Prior Publication Data

US 2004/0009411 A1 Jan. 15, 2004

(51) Int. Cl.[7] ................................................. G03F 9/00
(52) U.S. Cl. ............................................. 430/5; 430/30
(58) Field of Search ......................... 430/5, 30; 428/14; 355/75

(56) References Cited

U.S. PATENT DOCUMENTS

| | | | |
|---|---|---|---|
| 5,652,657 A | 7/1997 | Yoshii et al. | 356/394 |
| 5,742,386 A | 4/1998 | Nose et al. | 356/237 |
| 6,569,576 B1 * | 5/2003 | Hsueh et al. | 430/5 |

* cited by examiner

Primary Examiner—Saleha R. Mohamedulla
(74) Attorney, Agent, or Firm—Richard M. Kotulak (57) ABSTRACT

A mask structure and method of quantitatively measuring pellicle degradation in production photomasks by measuring overlay in test structures on the mask. A structure is located in a high transmission region close to a transition region between a low transmission and a high transmission region of the mask such that pellicle degradation impacts the printing of the object. A second structure is located in low transmission region such that the printing of the second structure overlaps the first and provides a measure of pellicle degradation.

15 Claims, 6 Drawing Sheets

Fig. 2

Mask distortion caused by a tapered pellicle

IN-SITU PELLICLE MONITOR

BACKGROUND OF THE INVENTION

This invention relates to monitoring a pellicle to determine when it wears out. More particularly it relates to methods and structures to monitor pellicles subject to exposure wavelengths that can cause pellicle thinning.

Typically people look at the pellicle in monochromatic light and look for signs that the mask pattern is "printing" onto the pellicle surface. The technique is not quantitative and not very sensitive. It also is sensitive to the wrong thing, namely thin-film interference within the pellicle, not externally measured change in optical path length. Thin film interference is sensitive to changes in nt (where n is the refractive index and t is the thickness), while external optical path length is sensitive to changes in (n−1)t.

An example of another system that is intended to determine pellicle life is provided by Japanese Application Number JP19870111206 19870506 entitled "Exposure Device" by Mitsubishi Electric Corporation. In that published application a light flux from an optical system is focused on a photo detector for measuring light intensity at wafer level. The light intensity is measured with and without a pellicle to determine the transmissivity of the pellicle. When the transmissivity of the pellicle falls below a certain set value the pellicle is considered worn out. Again this is another way of determining wear out by transmission loss.

Pellicles can be degraded by the exposure light during use. For 365 and 248 nm, this has not been a major problem, because the pellicle materials in use are very resistant to damage at those wavelengths. At increasingly short wavelengths, such as 193 and 157 nm, pellicles are much more easily damaged. Damage can show up as a change in transmission, thickness, index of refraction, or a combination of all three. Changes in pellicle transmission lead to dose changes during wafer exposure. This will cause image size changes which can readily be detected.

BRIEF SUMMARY OF THE INVENTION

However, non-uniform changes in optical path length of the pellicle (a function of thickness and index of refraction) can cause image position displacements which are not easily detected. It has proven extremely difficult to quantitatively measure the amount of optical path length change induced by photo-induced pellicle damage. This means that there is a risk of using a pellicle that has begun to induce optical distortions to the mask beneath it, or conversely to discard a pellicle out of excessive caution, before its life is over. This invention teaches a mask structure and method of quantitatively measuring pellicle degradation in production photomasks, by measuring overlay in test structures on the mask. A set of test structures that can be measured are placed in a transition region where the relative movement between them provides an indication of degradation. Once a predetermined displacement has taken place that impacts the quality or yield of the lithography process, the pellicle is considered worn out. Reference structures and additional monitor structures can be added to the mask to correct for displacement due to stepper error. Even more particularly a mask which comprises a first and second test structure; one structure located in a high transmission region close to a transition boundary between high and low transmission regions of the mask such that pellicle degradation impacts the printing of the object; the second structure located in the low transmission region of the mask close to the transition boundary such placement such that the structures will overlay each other. A second set of structures is used for control purposes to see if the difference in overlay is due to other factors The method then compares these structures to determine the image displacement due to degradation that is taking place.

DETAILED DESCRIPTION OF THE INVENTION

The pellicle wear out monitor of this invention is designed to detect non-uniform pellicle thinning, which can lead to intra-field image placement errors. Pellicle thinning is caused by damage to the pellicle material induced by exposure to the stepper illumination source. This is not expected to occur, and has not been seen in i-line or 248 nm steppers, as long as the correct pellicle material is used at those wavelengths. Lab measurements of pellicle materials indicate a strong potential for pellicle thinning at the 193 nm exposure wavelength. It is difficult to make a quantitative estimate of the expected lifetime of pellicles used at 193 nm, partly because of uncertainty in the experimental tests of the material, and partly because of the practical difficulty of tracking the exact exposure that a pellicle has seen throughout its lifetime in the manufacturing line.

One can theoretically understand the relationship between pellicle thinning and shifts in image placement. The main uncertainties are related to the amount of exposure seen by the pellicle and the amount of thinning caused by a given level of exposure. Testing indicates that substantial thinning may begin to occur at integrated doses of between 2 kJ/cm$^2$ and 5 kJ/cm$^2$ of 193 nm radiation. In comparison, pellicles used at 248 nm exposure wavelength have quoted lifetimes of 500 kJ/cm$^2$.

When the pellicle thins, there is typically a region of image displacement at the boundary between high transmission and low transmission regions of the mask, as between a DRAM array and the surrounding support areas, or between the product and kerf areas of the mask. The image displacement is caused by uneven thinning of the pellicle between the highly illuminated areas and the dark areas of the mask. The pellicle wear out monitor of this invention is intended to be used on bright field photomasks that will be exposed at any wavelength likely to cause damage to the pellicle. It is placed at a sharp boundary between a large bright area and a large dark area for maximum sensitivity to uneven pellicle thinning. Ideally, it should be placed at the boundary between the bright field exposure area and the opaque chrome frame. This region should have the maximum sensitivity to pellicle thinning of any part of the exposure field. The pellicle wear out monitor described herein is designed to magnify the measured image placement error by 2 times, which will give an additional safety margin when determining when the pellicle is worn out and must be replaced.

Figure 1:
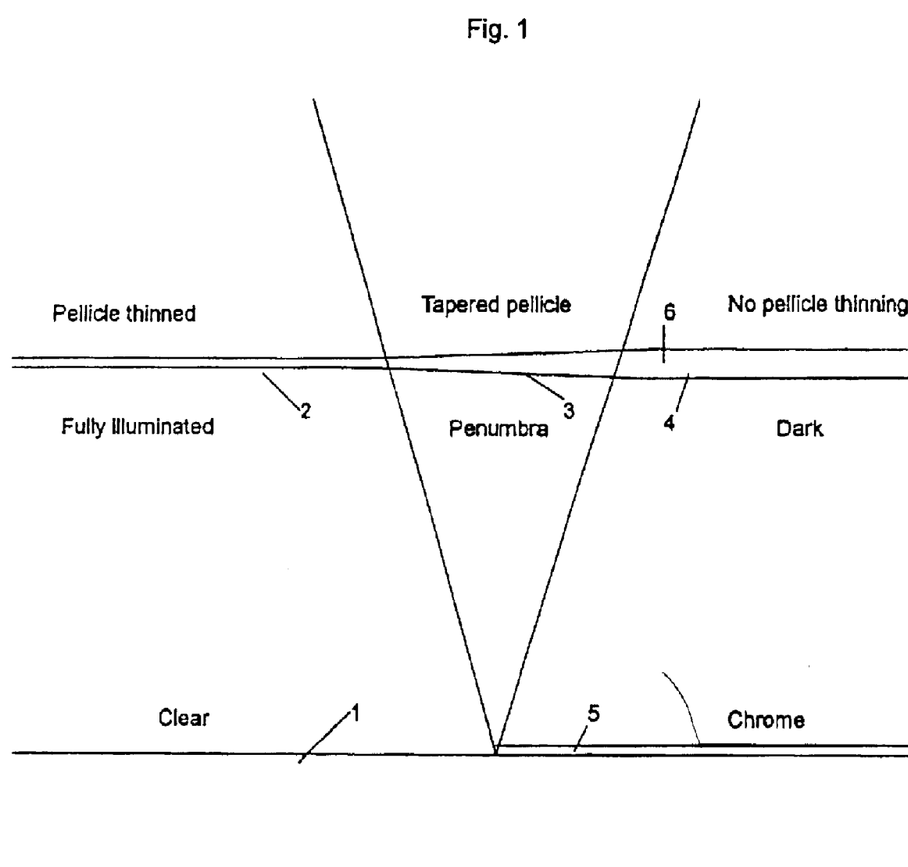
FIG. 1 illustrates in diagram form non-uniform pellicle thinning.
Figure 2:
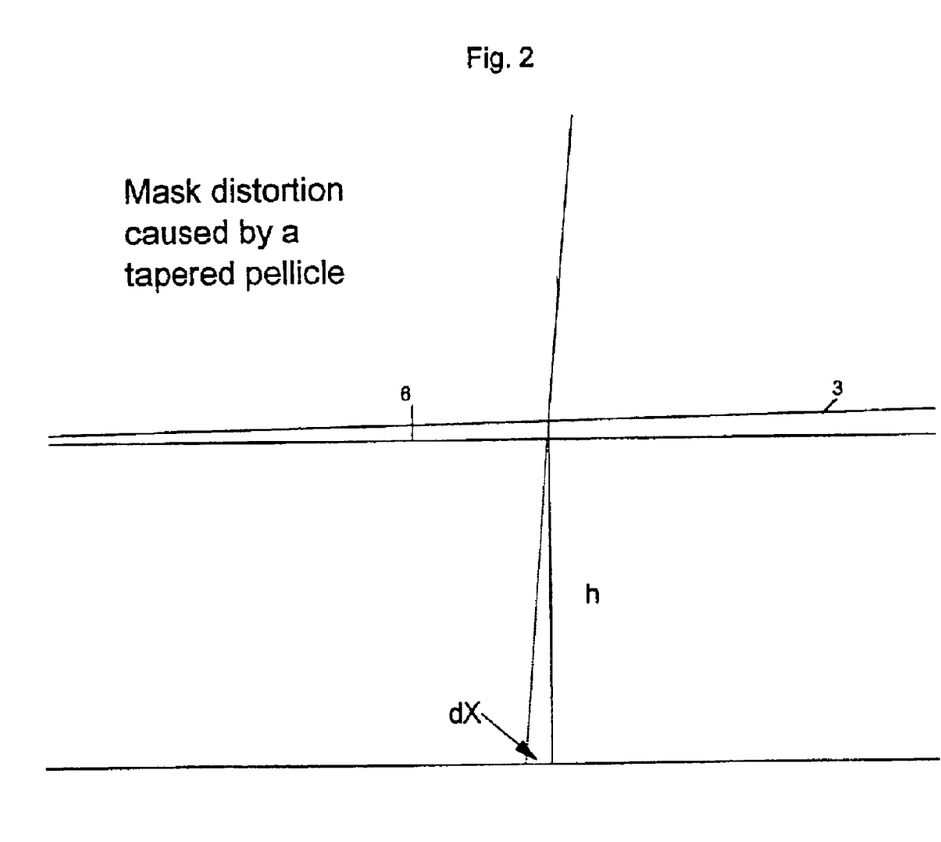
FIG. 2 illustrates in diagram form how image displacement occurs at a boundary between high transmission and low transmission area due to pellicle degradation.

The most severe image placement problem occurs at the boundary between a large clear region of a mask and a large opaque region. As seen in FIG. 1 light passing through the clear region 1 does maximum damage to the pellicle lying over that region, while the pellicle lying above the opaque region 5 is not damaged. Between the two regions lies a section 3 of pellicle 6 that is exposed to a gradient of light intensity, smoothly increasing between the dark area and the fully illuminated area. As seen in FIG. 2 if the pellicle is thinned proportionally to the amount of light exposure it has received, it will develop a wedge-shaped cross-section 3 in the partially illuminated area. This wedge-shaped region will act as a very weak prism, deflecting by a tiny amount the light that passes through it. Because of the relatively large distance h between the pellicle and the reticle (3–5 mm), the tiny displacement angle can lead to several tens or hundreds of nanometers of image shift dx. Only the images that lie under the tapered part of the pellicle are displaced by a pellicle damaged in this way. Features in a uniformly thinned region 2 of the pellicle 6 in FIG. 1 or an undamaged region 4 in FIG. 1 are not displaced at all. This produces an effective optical distortion of the mask surface, with images at the edges of large bright regions being displaced inward toward the bright region, and regions at edges of large dark regions being displaced outward. The transverse dimensions of the tapered region of the pellicle are determined by the pellicle standoff height and the numerical aperture of the stepper illuminator. For a typical pellicle height of 4 mm and illuminator NA of 0.075, the width of the tapered region will be about 600 um. Mask objects centered beneath this tapered region will be displaced, with the displacement gradually disappearing for objects further away from the tapered region.

Figure 3:
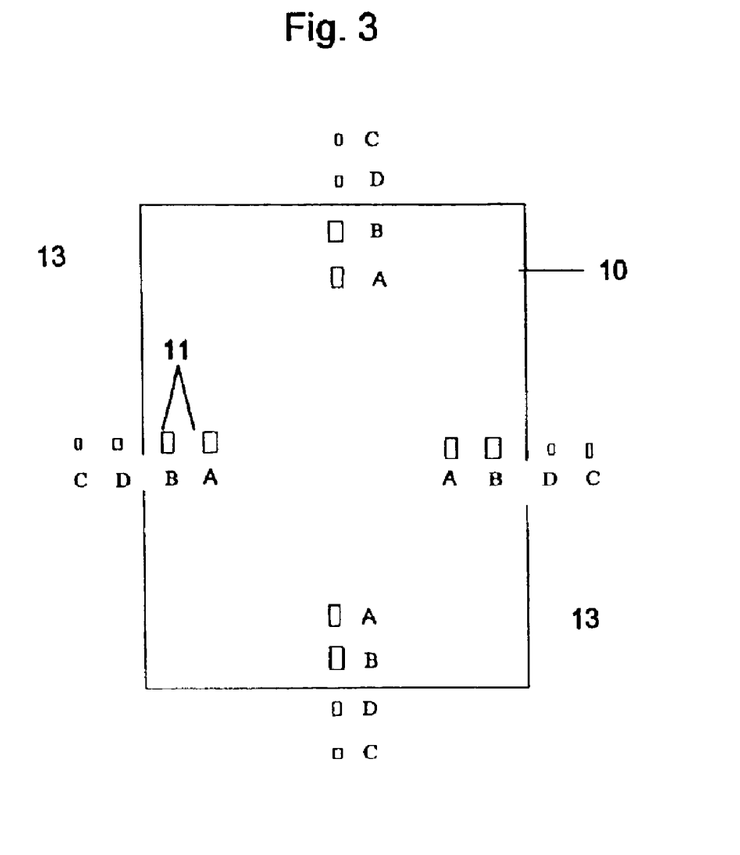
FIG. 3 illustrates in diagram form how structures could be placed adjacent a transition area to measure this pellicle degradation.

The masks most seriously affected by pellicle degradation are bright-field masks. Dark-field masks (e.g. contact hole arrays) provide so little optical exposure to the pellicle that there is generally no degradation. The transition from the exposure field to the opaque frame of a dark-field mask provides a worst-case test area to evaluate pellicle degradation. For the purposes of the specification high transmission regions and clear are often used synonymously. Likewise low transmission regions and opaque regions are often used synonymously. The point is that regions do not have to be entirely opaque or entirely clear in order to apply the teachings of this invention. FIG. 3 illustrates how structures could be placed adjacent a transition area to measure pellicle degradation.

On each side of the mask 10, two opaque squares 11 and 12 are placed, one (B) very close to the opaque frame (e.g. within 50 um of the frame) and the other (A) far enough from the edge that it is completely out from under the tapered area of the pellicle (typically<600 um from the frame). Two corresponding clear squares (C and D), slightly smaller than the opaque squares just described, are placed in the opaque frame 13 in such a way that they will exactly overlay the opaque squares from a neighboring exposure field when printed on a wafer. When printed on the wafer, these overlaid structures will create a box-in-box feature ideally suited for overlay measurements. Such interlocking structures are commonly used to discover printing errors such as die rotation, magnification errors, or wafer scale errors. In fact, the set of squares farthest from the boundary (A and C) between the opaque frame and the clear exposure field will show exactly these sorts of printing errors. However, the set of squares closest (D and B) to the exposure field boundary must show exactly the same placement errors as the more remote squares if the pellicle is perfect. Degradation of the pellicle will exhibit a different apparent field magnification (or wafer scale) error for the inner set of squares vs the outer set, because the one set of squares sits under the area of the pellicle most susceptible to taper formation, while the other set does not.

The use of a dual set of structures in FIG. 3 when printed measures more than pellicle degradation. Rotation, skew, and magnification can be calculated from the interlocking structures A and C. The interlocking structures B and D give the same information, except that the difference between magnification from A and C and magnification from B and D gives a measure of the distortion induced by pellicle aging. All of the other components of overlay should be identical, and give redundancy for error checking and measurement accuracy estimation. Because B is displaced inward and D is also displaced inward by a damaged pellicle, the overlay of B and D will double the sensitivity of the measurement.

If structures C and D are obscured by the framing blades of the stepper, the mask could be exposed on a monitor wafer with the framing blades withdrawn to expose C and D. This test could be done at established intervals just to monitor the health of the pellicle.

Figure 4:
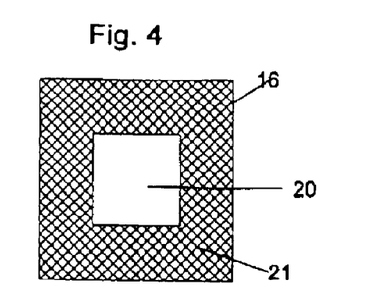
FIG. 4 illustrates in diagram form how the wear out monitor will print on the wafer as a clear, square opening in a square pad of resist.

Details of an exemplary embodiment are the following:

1. In the preferred embodiment of this invention the wear out monitor will print on the wafer as a clear, square opening in a square pad of resist. These are shown as 20 and 21 in FIG. 4. The designer can select the dimensions of the resist square and the clear square based on the requirements of the metrology equipment used to measure the overlay. The monitor structure 16 will be measured for overlay of the clear square within the resist square. Typical dimensions could be 10×10 Âμm for the resist square 21 and 5×5 Âμm for the clear opening 20.

Figure 5:
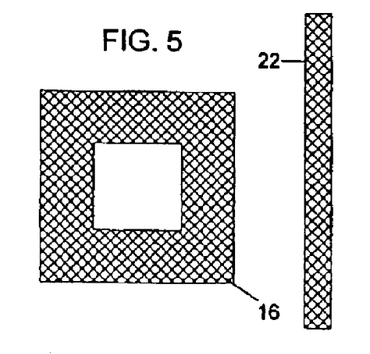
FIG. 5 illustrates in diagram form where the wear out monitor should be placed relative to the edge of the exposure field.

2. Referring to FIG. 5 the wear out monitor 16 should be placed as close to edge 22 of the exposure field as possible, without interfering with the ability to measure the monitor for overlay.

Figure 6:
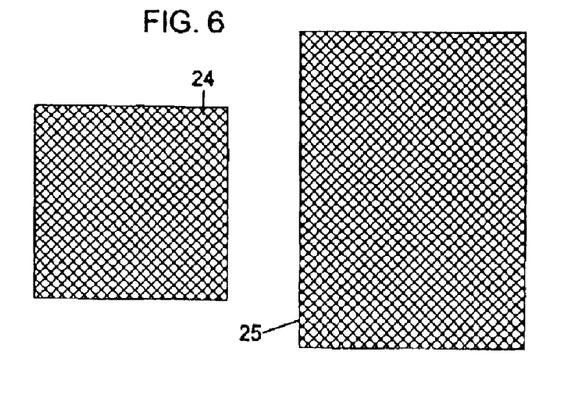
FIG. 6 illustrates in diagram form the layout of the opaque monitor structure on a mask near the frame.
Figure 7:
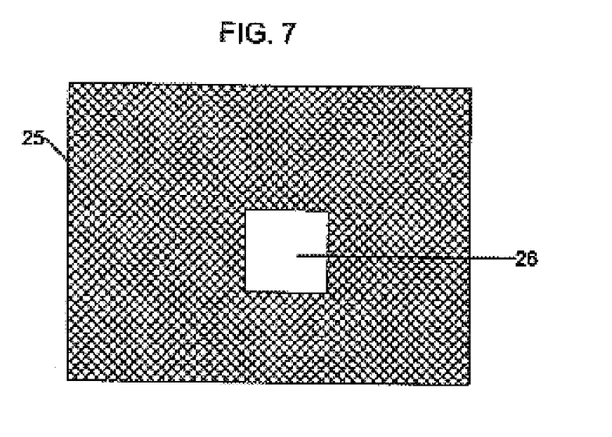
FIG. 7 illustrates in diagram form the layout of a clear monitor structure in the frame.
Figure 8:
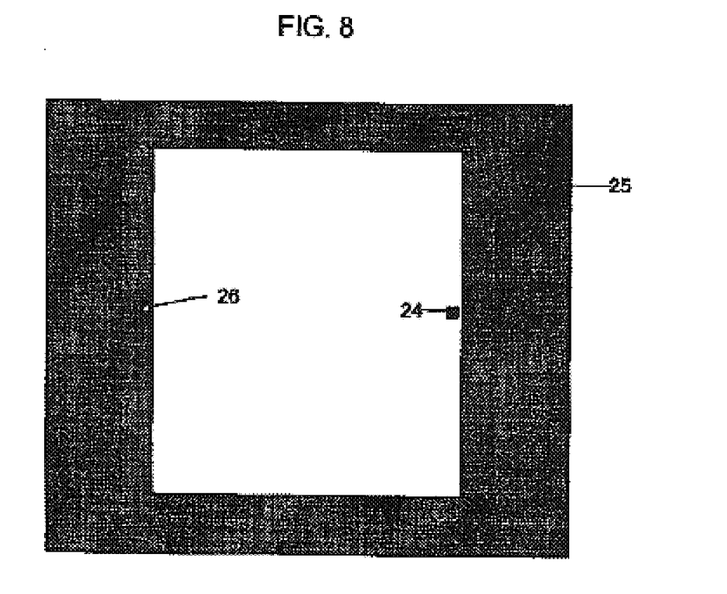
FIG. 8 illustrates in diagram form the layout of the monitor structures as they would appear on a mask near the frame.

3. Referring to FIGS. 6, and 8 the actual layout of the monitor consists of two parts, an opaque square 24 near the chrome frame 25 of a bright field mask and a clear square 26 in frame 25 on the opposite side of the mask as shown in FIGS. 7 and 8. The separation between the centers of the two squares 24 and 26 must be exactly equal to the stepping distance, so the clear and opaque squares will interlock when the pattern is printed.

The particulars of placement are the following:

1. The two squares which make up the wear out monitor must be close to the chrome frame in order to allow them to interlock when the pattern is stepped onto the wafer. Also, the sensitivity of the measurement will be maximum at the boundary between a large clear area and the opaque frame. The worst image shifts will occur within a distance of:

$$x = \frac{NA \cdot \sigma \cdot h}{Mag^2}$$

on each side of the frame boundary, but residual image shifts will be seen up to a distance of:

$$x_r = \frac{NA \cdot (\sigma + 1) \cdot h}{Mag^2}$$

In these equations, NA and If are the numerical aperture and partial coherence factor used to expose the mask, Mag is the stepper magnification, and h is the pellicle standoff height. In the case of annular illumination, If should be taken as the outer If of the annular illumination.

Example: A 4× stepper with NA=0.72, r=0.60, and pellicle height 4 mm will have a region of maximum image shift within 108 Åμm on each side of the frame edge, and residual image shifts will be seen out to a distance of 288 Åμm from the edge of the frame. The equations give x and $x_r$ in wafer scale dimensions.

2. Both squares should be adjacent to relatively clear areas extending at least 2× into the exposure field, where x is defined in the equation above. "Relatively clear" means that the average transmission over the clear region should be as high as possible, preferably>90%. Mask patterns within this zone will not degrade the sensitivity of the measurement as long as the average intensity is high. If there is no region meeting this specification, the squares should be placed adjacent to areas with the highest average transmission within a radius of 2× from the location of the squares. Both the clear and the opaque squares are affected by the adjacent clear areas, so the location should be chosen to maximize the transmission adjacent to both squares. It is preferred that the squares interlock, so they should be directly across from each other. Corner locations are not ideal, because half of the light in the clear area is obstructed by the adjacent side of the frame.

3. If the wear out monitor is placed in an ideal, high contrast area near the frame, it will indicate degradation in the pellicle long before it can affect product yield. There are certain design scenarios in which the monitor will not work. The worst case would be mask design with very low transmission near the frame, but a large, highly transparent region far away from the frame. In this case, it is possible to look for pellicle degradation by monitoring overlay to a previous level, placing the overlay measurement structures near the boundary between the transparent region and adjacent opaque regions. In this case the wear out monitor structure would be embedded on masks for two levels. One mask level would either have no pellicle or be exposed using a pellicle where no or little degradation has occurred, the other being in the transition region where non-uniform degradation takes place.

Figure 9:
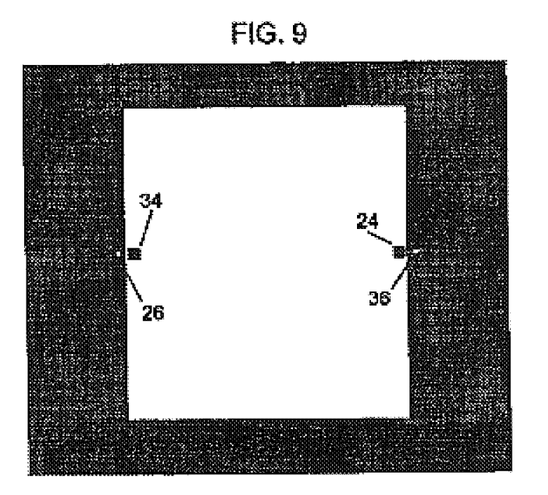
FIG. 9 illustrates in diagram form the layout of two sets of symmetrical monitor structures.

4. The accuracy of the measurement could potentially be affected by measurement tool image shift (TIS) or other effects. If this is a concern, a second set of wear out monitor structures, 34 and 36 in FIG. 9, could be added to the design. This provides us with measurement sites reflected symmetrically through the center line of the mask. The monitors could be aligned vertically instead of horizontally, if desired, or a total of four monitors could be used, one on each side of the mask.

Details concerning measurement of the monitor are provide in the following:

1. When the pellicle begins to degrade from exposure to the stepper illumination, the images of the squares will be slightly displaced toward the bright areas of the mask. Both the clear square and the opaque square in the structure will be displaced toward the center of their exposure fields, but because the two parts of the structure are printed in two adjacent fields, the relative displacements will be in opposite directions. When the centration of the clear square within the opaque square is measured with an overlay measurement tool, the measurement will indicate a placement error twice as large as the worst placement error actually present within the exposure field. Tolerances can be defined to determine when the pellicle must be replaced.

Figure 10:
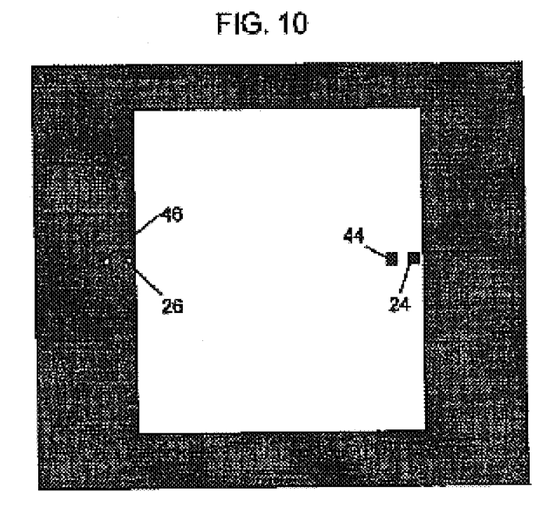
FIG. 10 illustrates in diagram form the layout of monitor structures and reference structures.

2. Stepping and magnification errors in the stepper will induce errors in reading the Pellicle wear out monitor. Placement errors from these sources will affect the Monitor just as placement errors from a degraded pellicle do. If control of stepping scale and magnification is accurate enough, the errors measured by the wear out monitor can all be attributed to the pellicle. If the stepper errors are not sufficiently small to be ignored, then a second set of reference monitor structures 44 and 46 can be added to the mask as shown in FIG. 10. If these additional reference monitors are placed in uniformly illuminated areas (regardless of the magnitude of the light transmission), then they will not suffer image shifts when the pellicle thins, and can be used to remove any stepping and magnification errors. The net value of image shifts caused by pellicle thinning would then be the difference between the reference monitor and the pellicle wear out monitor measurements.

3. In a bright field pattern with very low pattern density, the two parts of the reference monitor can be placed at least a distance $x_r$ away from the edge of the chrome frame. The wear out monitor still needs to be as close to the edge of the frame as possible.

4. It is possible to measure the wear out monitor on product wafers, but it is preferred to make a special exposure on a monitor wafer. This will give a planar resist surface for the exposures and remove the confusion of measuring over previous levels of patterning on the wafer. If a reference monitor is used in addition to the wear out monitor, the stepper framing blades may need to be retracted to expose the clear square component of the reference monitor.

Example: For a level using a 40 mJ/cm2 resist, with 75 exposure fields per wafer, using a 4× stepper whose lens has a 60% transmission, 500 J/cm2 Åμ would be reached after 1600 wafer exposures.

While the embodiments provided in this application use squares as structures and place them relative to the frame of a mask, this invention is by no means limited to the those structures and relative placements. Any structure that could be used to measure displacement could be applied to this invention. Other simple examples would be a bar within a bar or a frame within a frame. Nor do they have to be of the same form, for example, a circle within a square, so long as layout and printability issues are taken into account. Likewise, the structures could be placed in other areas of a mask, where transitions from bright field to dark fields take place and that allow one to compare displacement in these transition areas to areas where no displacement should take place.

Therefore, while the invention has been described with reference to the embodiments provided herein, it is not confined to the details set forth herein. The specification and examples are only exemplary, so the invention should be construed only with regards to the claim appended hereto.

What is claimed is:

1. A mask having a pellicle, the mask which comprises:
a first and second monitor structure;
the first monitor structure located in an clear region close to a transition region between an opaque and clear region of the mask such that pellicle degradation impacts the printing of the structure;
the second structure located at a position on the mask such that it overlaps with the first when printed.

2. The mask of claim 1 wherein the first and second monitor structure are structurally of the same form.

3. The mask of claim 1 wherein the first and second monitor structures are placed at a stepping distance that will cause them to overlap when printed on a substrate.

4. The mask of claim 3 wherein the first structure monitor structure is located in an opaque frame and the second structure is located in a clear region close to the frame.

5. The mask of claim 2 wherein the first and second monitor structures are squares with the one in an opaque frame being clear and the one in the clear region opaque.

6. The mask of claim 1 wherein squares are placed 2× into an exposure area from edge formed between the clear and opaque regions.

7. The mask of claim 1 also comprising a second mask for an adjacent level wherein a monitor structure is placed at the same relative location as a structure on the mask for which pellicle degradation is being measured.

8. The mask of claim 2 also comprising an additional set of reference structures is placed in an uniformly illuminated area.

9. The mask of claim 8 wherein the reference structures are at least a distance xr away from the edge formed between the clear and opaque regions.

10. The mask of claim 4 also comprising a second set of symmetrically placed monitor structures alongside the frame on the opposing side of the mask.

11. The mask of claim 5 wherein the first and second monitor structures are placed at a stepping distance and where one of the structures is smaller than then other so that they will interlock when printed.

12. A mask which comprises:
a first set of monitors which comprise a first object located close to a transition area between an opaque and clear region and a second object located in an adjacent exposure field of the mask area in a location such that the first and second objects would overlap when printed;
a second set of monitors, which comprise a third object and a fourth object which are coincident to the first and second objects except placed at a distance away from the first and second objects such that pellicle degradation will not affect their placement.

13. The mask of claim 12 wherein the transition area is defined by frame of the mask.

14. The mask of claim 12 where the first, second, third and fourth objects configured so that difference between the overlays of the first and the second objects as relative to the differences in the third and fourth objects would measure pellicle degradation.

15. The mask of claim 12 where all the objects are square.

* * * * *